United States Patent [19]
Baker

[11] 4,099,325
[45] Jul. 11, 1978

[54] MACHINES FOR INSERTING ELECTRIC CIRCUIT COMPONENTS ON PRINTED CIRCUIT BOARDS

[75] Inventor: Howard Burgess Baker, Coventry, England

[73] Assignee: The General Electric Company Limited, London, England

[21] Appl. No.: 767,056

[22] Filed: Feb. 9, 1977

[30] Foreign Application Priority Data

Feb. 10, 1976 [GB] United Kingdom .............. 5104/76

[51] Int. Cl.² .......................................... H05K 3/30
[52] U.S. Cl. ...................................... 29/741; 29/626; 29/809
[58] Field of Search ............... 29/739, 741, 809, 818, 29/701, 704, 626

[56] References Cited
U.S. PATENT DOCUMENTS

| 3,508,315 | 4/1970 | Hoffken ............................ 29/741 X |
| 3,608,175 | 9/1971 | Lambrecht ........................ 29/741 X |
| 3,893,232 | 7/1975 | Fletcher et al. ................... 29/741 X |

*Primary Examiner*—Carl E. Hall
*Attorney, Agent, or Firm*—Kirschstein, Kirschstein, Ottinger & Cobrin

[57] ABSTRACT

An automatic component insertion machine in which at least some of the component holding units each comprise a plug-in key unit which electrically identifies a respective component type and which is mechanically coded so as to accept only a correspondingly coded packaging stick containing the respective components. The packaging stick may be filled at a testing station which is similarly mechanically coded.

5 Claims, 3 Drawing Figures

MACHINES FOR INSERTING ELECTRIC CIRCUIT COMPONENTS ON PRINTED CIRCUIT BOARDS

The present invention relates to machines for inserting electric circuit components on printed circuit boards.

According to the present invention in a machine for inserting any one of a plurality of different electric circuit components in a respective position on a printed circuit board, the circuit components being taken as required from respective holding locations in the machine, at least one of said holding locations comprises a first unit which is arranged to be electrically connected to control means of the machine to present to said control means electrical characteristics identifying a respective circuit component, and which has an exteranl shape at least part of which also serves to identify said respective circuit component, and a second unit which is arranged to hold a plurality of said respective circuit components and which or part of which is shaped to be attachable to or adjacent only the respective first unit.

The first unit may comprise an electrical plug connector which may be inserted into any one of a plurality of socket connectors provided on the machine, at least some of the pins of said plug connector being electrically interconnected such as to identify the respective circuit component. Part of said plug connector may be of a shape which is coded to identify said respective circuit component such that only a second unit bearing a complementary coded shape may be attached at that holding location. The plug connector may be provided on one face with a group of ribs for slots and the respective second unit may be provided with a complementary group of slots or ribs.

The shape code identifying a respective circuit component may also be provided at a testing station for said circuit components, whereby a second unit can be loaded only with tested circuit components of the respective type.

A machine for inserting electric circuit components on printed circuit boards, the machine being in accordance with the present invention, will now be described by way of example with reference to the accompanying drawing of which:

Figure 1:
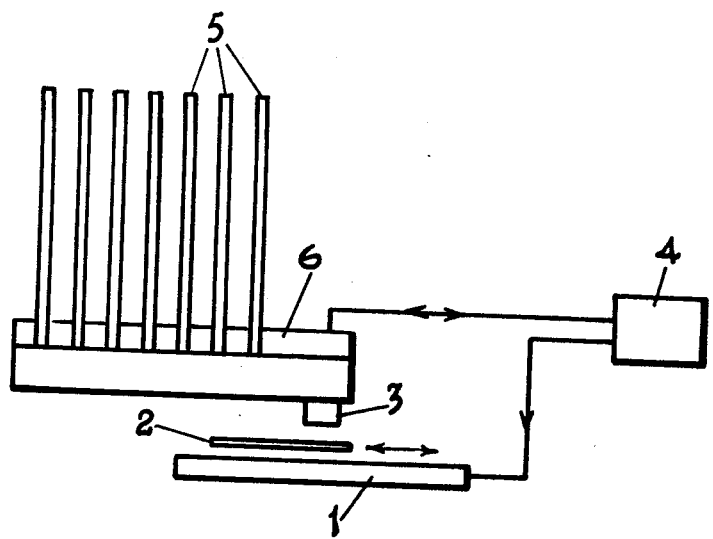
FIG. 1 shows the machine schematically.

Referring first to FIG. 1, the machine comprises a base or table 1 on which each printed circuit board 2 may be supported in turn and which has known means for moving each printed circuit board 2 generally in its own plane such that different parts of the board are positioned in succession under a component insertion head 3. The components (not shown), which may for example comprise dual-in-line packaged integrated circuits, are fed to the insertion head 3 in the order required by a prerecorded programme held by a control arrangement 4, which also controls the movements of the table 1, from respective holding points or detachable magazines 5, different magazines 5 holding different types of integrated circuit.

Figure 2:
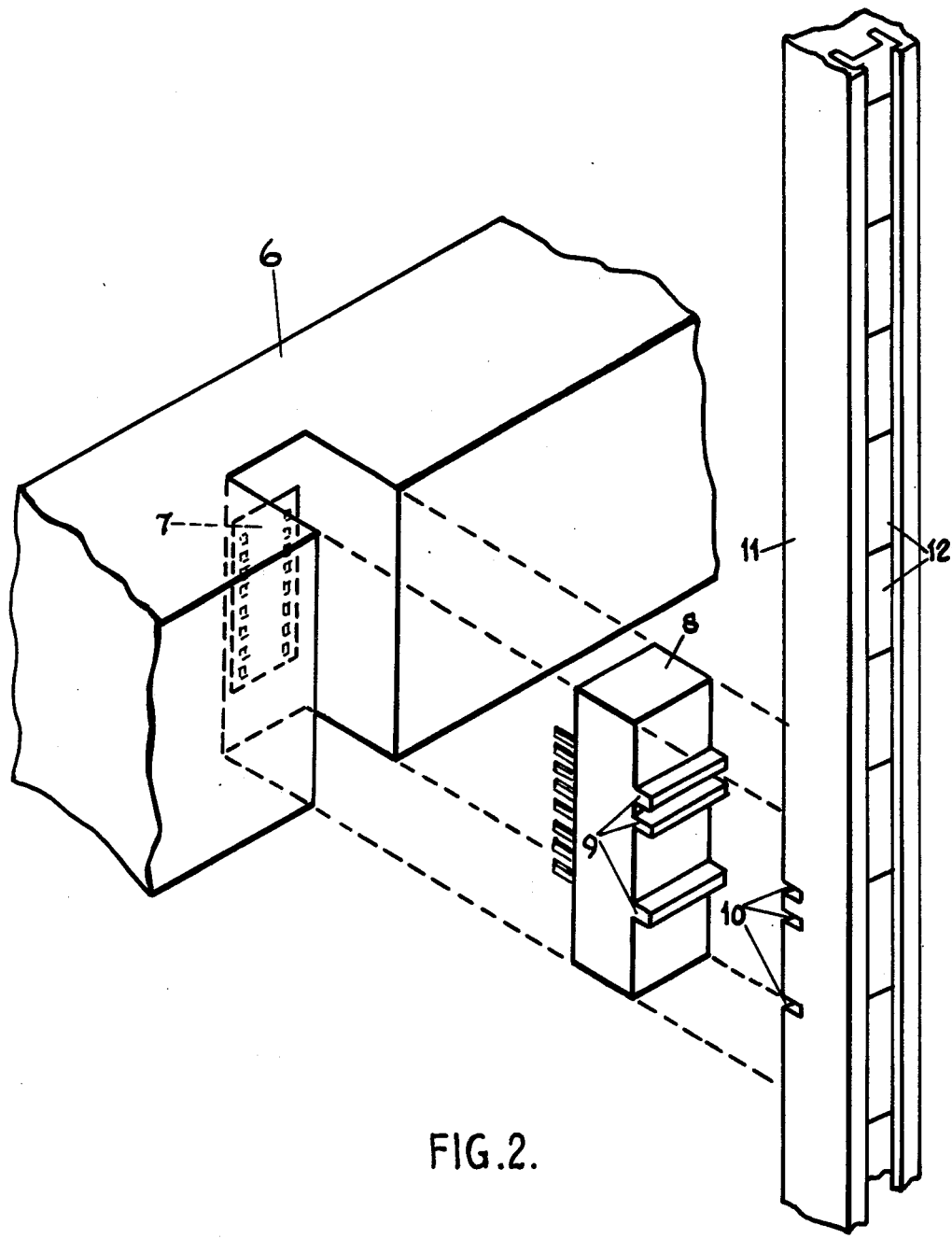
FIG. 2 shows a fragmentary view of part of the machine.

Referring now to FIG. 2 part of the machine structure 6 adjacent the magazine attachment points (not shown) is provided with a plurality of multi-way electric sockets 7, one adjacent each attachment point, only one of which sockets is shown. Into one or more of these sockets 7, which are connected to the control arrangement 4, are inserted respective plugs 8 inside each of which there are provided one or more electric circuits interconnecting selected ones of its pins such that each plug 8 presents to the control arrangement 4 an indication characteristic of a respective type of integrated circuit, for example by means of interconnected pins or a read only memory within the plug 8. The rear face of the plug 8 bears a coded arrangement of ribs 9 which cooperate with corresponding slots 10 in a detachable magazine 11 to ensure that only magazines having the required pattern of slots may be attached at that particular attachment point.

Figure 3:
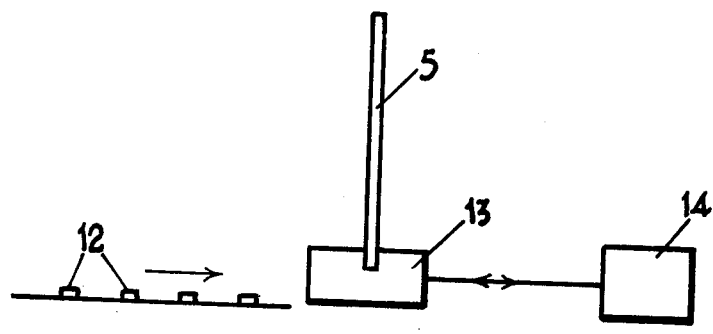
FIG. 3 shows schematically a component testing arrangement.

Referring also to FIG. 3, the integrated circuit packages 12 for insertion on the printed circuit boards 2 may be tested before being brought to the insertion machine by test apparatus 13 so that, using means similar to socket 7 and plug 8 of FIG. 2, there ae loaded into the magazine "stick" 11 only those integrated circuits 12 which pass tests applied by a control arrangement 14 which are appropriate to the circuit type indicated by the slot code 10 of what magazine 11, and hence by the rib code and electrical connections of the corresponding plug 8. In this way only tested integrated circuits 12 of the appropriate type can be inserted in a magazine 11 and that magazine 11 can only be positioned on the component insertion machine at the attachment point marked by the corresponding plug 8. The control programme of the machine is arranged to coordinate the selection of an integrated circuit from its respective magazine 11, as marked by the plug 8, and the positioning of the printed circuit board 2 so that the integrated circuit 12 is inserted where required on the board.

I claim:

1. A machine for inserting in a respective position on a printed circuit board any one of a plurality of different electric circuit components taken as required from respective holding locations in the machine comprising control means and, at one of said holding locations first means which is electrically connected to said control means to present to said control means electrical characteristics identifying a respective circuit component and which first means has an external shape at least part of which also identifies said respective circuit component, and second means which is arranged to hold a plurality of said respective circuit components and at least part of which is shaped to be attachable adjacent only the respective first means.

2. A machine in accordance with claim 1 wherein said first means comprises an electrical plug connector which is insertable into any one of a plurality of socket connectors provided on the machine.

3. A machine in accordance with claim 2 wherein at least some of the pins of said plug connector are electrically interconnected such as to identify the respective circuit component.

4. A machine in accordance with claim 2 wherein the plug connector is provided on one face with a group of ribs and a respective second means is provided with a complementary group of slots.

5. A machine in accordance with claim 1 including a testing station for said circuit components at which the shape identifying a respective circuit component is utilised such that a second means is loaded only with tested circuits of the respective type.

* * * * *